TRANSISTOR MOUNTING PAD

Filed Oct. 5, 1959

EDWARD J. KISLAN
HUBERT H. HOELTJE
NEIL O. REGAN
INVENTORS

BY

ATTORNEY

United States Patent Office 3,122,679

Patented Feb. 25, 1964

3,122,679

TRANSISTOR MOUNTING PAD

Edward J. Kislan, Pacoima, Hubert H. Hoeltje, Canoga Park, and Neil O. Regan, Glendale, Calif., assignors, by direct and mesne assignments of sixty percent to Hubert H. Hoeltje, Jr., Garden Grove, Calif., and of forty percent to Martin Stern, Los Angeles, Calif.

Filed Oct. 5, 1959, Ser. No. 844,464
1 Claim. (Cl. 317—100)

The present invention relates to a transistor mounting pad of the type which will maintain the transistor spaced from a circuit board to thereby prevent moisture entrapment between the base of the transistor and the circuit board.

As is well known in this art, moisture has a deleterious effect upon the characteristics of the transistor and its circuit and where transistors are utilized in aircraft by way of example, it it important that the integrity of the circuit be maintained.

An object is the provision of a mounting pad which will accommodate various and sundry types of transistors in such a manner that the transistors and the said pads may be mounted on etched circuit boards by automatic machinery.

A further object is the provision of a transistor mounting pad or spacer which eliminates all need for any jig for the spacing of the transistor and its mounting pad during dip solder operation.

Another object is the provision of a transistor mounting pad which provides a stable platform for the transistor while the assembly of the transistor and the mounting pad is under vibration or shock resultant upon use.

A further object is the provision of a transistor mounting pad or spacer which prevents damage to the transistor during all soldering operations.

A further object is the provision of a transistor mounting pad or spacer so designed as to overcome irregularities of a circuit board surface and to provide uniform mounting conditions.

Other objects and advantages of the invention will be apparent to those in the electronic art where transistors are employed.

With the above mentioned and other objects in view the invention contemplates a simple, inexpensive, foolproof and superior means for the mounting of transistors on a circuit board.

Figure 1:
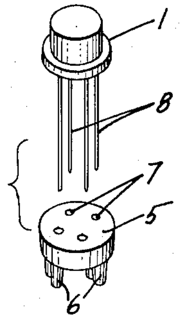
FIGURE 1 is a separated view showing a transistor and a transistor mounting pad or spacer.
Figure 2:
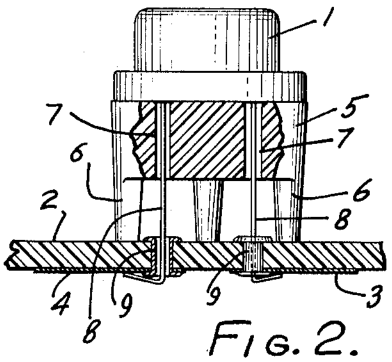
FIGURE 2 is an enlarged fragmentary partially sectional view of a transistor and the mounting pad or spacer of the invention supporting said transistor above a circuit board.
Figure 3:
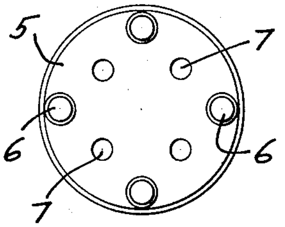
FIGURE 3 is a bottom plan view of the transistor mounting pad or spacer shown in FIGURE 2.
Figure 4:
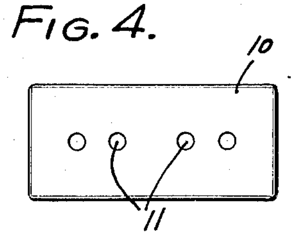
FIGURE 4 is a plan view of a rectangular shaped transistor mounting pad or spacer.
Figure 5:
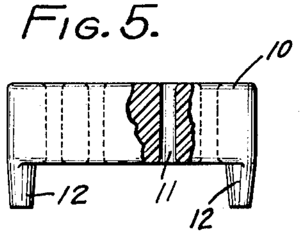
FIGURE 5 is a fragmentary, partially sectional side elevation of the mounting pad or spacer shown in FIGURE 4.
Figure 6:
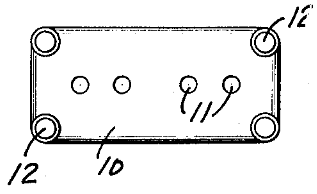
FIGURE 6 is a bottom plan view of the mounting pad or spacer shown in FIGURES 4 and 5.

Referring now to the drawing and specifically to FIGURES 1, 2 and 3, we have shown at 1 a transistor and its case, the case having an enlarged diameter base as shown. As is generally known, a transistor is a type of crystal diode and is usually made from a germanium or a silicon crystal. The base of the case may have leads extending therefrom which leads connect with contacts engaging the crystal. Two of the leads are known as the emitter and collector respectively, while various other leads, usually one although sometimes multiple, have connection with the base carrying the crystal.

In FIGURE 1 we have shown four leads from the transistor although obviously three leads might be provided. A circuit board is shown at 2 and the under surface of said board 2, in the present instance, carries what is known in the art as a printed circuit here indicated at 3 and 4. Generally the base of the transistor 1 rests upon the top of the circuit board 2 while the leads are passed through insulation type eyelets or ferrules and then soldered to the circuitry carried by the board, either by the dip method or hand method. Due to difficulties that have been encountered, particularly due to moisture, unevenness between the base of the transistor and the top of the circuit board as well as other difficulties as set forth in the statement of the objects of the present invention, we have provided a mounting pad or spacer which separates the transistor from the top surface of the circuit board 2. Referring to one form of mounting pad or spacer, to wit: the type shown in FIGURES 1 to 3 inclusive, this type includes a top member 5 and equidistantly spaced legs 6 secured to the top. Preferably the top 5 has substantially the same diameter as the diameter of the flange or base portion of the transistor case although the diameter of the table member may be of slightly greater diameter than the transistor case base. Furthermore, to lend stability to the structure, the top member 5 is preferably thick transversely, and the legs 6 may have a height equal to the thickness of the top member and the combined height of the top member and the legs may be substantially the height, or slightly greater than the height or depth of the transistor case. In the showing of FIGURE 2, the height of the mounting pad or spacer is slightly greater than the depth of the transistor case. The purpose, however, is to provide a mounting pad or spacer which is stable when resting upon the mounting board 2. The top member 5 is transversely bored at a plurality of points, as shown in FIGURE 2, at 7 and these bores are so spaced and arranged as to permit passage therethrough of the leads designated generally as 8 depending upon the transistor. Also, the diameter of the bores 7 is such as to be greater than the diameter of the leads 8 so that the said leads may be axially positioned within the said bores 7, as shown in FIGURE 2.

As shown in FIGURE 2 the circuit board 2 is provided with transverse bores within which are insulation type bushings or ferrules or eyelets 9 with the leads 8 passed therethrough and then bent for contact with the desired type circuitry 3 and 4. Tension on the leads 8 maintains the mounting pad and transistor together with the circuit board 2 in working relationship and against displacement. The leads 8 may be soldered to the circuitry by hand or by dipping. Thus it is apparent that the mounting pad or spacer is easily assembled and that said mounting pads or spacers due to the provision of the feet 6 overcome irregularities in the circuit board surface and provide for uniform mounting of the assembled transistors and mounting pads. As a rule the leads 8 are of extended length and after said leads have been passed through the bores 7 of the mounting pad and likewise through the ferrules or eyelets 9 that the ends of said leads may be trimmed and formed on the circuit side. We have also found that the mounting pad or spacer may be formed from plastic of the heat resistant type such as a thermo setting plastic, or a thermo plastic to adapt the spacers for use in either commercial or military planes.

The remaining forms of mounting pad or spacer shown in FIGURES 4 to 10 inclusive, differ from the form shown in FIGURES 1 to 3 inclusive in the shape thereof. For instance, in FIGURES 4 and 5 the top 10 is rectangular and the bores 11 therein, to accommodate the transistor leads, are in alignment. Certain types of transistors would be best accommodated by a mounting pad or spacer of this type, variance being due to the shape of the transistor base. As before, this type is likewise provided with legs 12.

Figure 7:
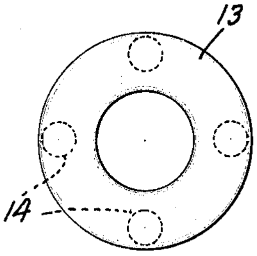
FIGURE 7 is a further modified form of transistor mounting pad shown in top plan.

The form shown in FIGURE 7 differs from the types shown in FIGURES 1 to 6 inclusive in that the top member 13 is of annular form with legs 14 spaced 90° apart from the bottom of said top member. In this form of the invention the central opening of the annular top member is of sufficient size to allow the transistor leads to pass therethrough without effecting their parallel relationship and likewise through openings provided for that purpose in the circuit board 2. The result is the same as for the form of the invention shown in FIGURES 1 to 3 so far as trimming and securing the ends of the leads to the circuitry 3 and 4 is concerned.

Figure 9:
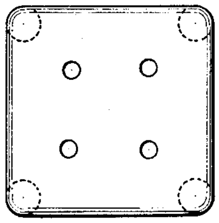
FIGURE 9 is a further modified form of transistor mounting pad or spacer, the form being substantially square in outline.
Figure 10:
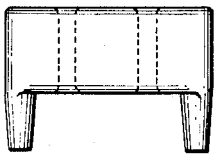
FIGURE 10 is a side elevation of the mounting pad or spacer shown in FIGURE 9.

FIGURES 9 and 10 show a square form of top member with leg members at each corner of the square top and with the top provided with transverse bores for passage therethrough of the leads 8.

Figure 11:
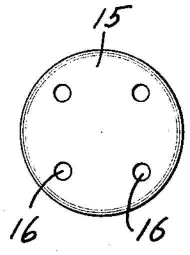
FIGURE 11 is a top plan view of a circular form of mounting pad or spacer.
Figure 12:
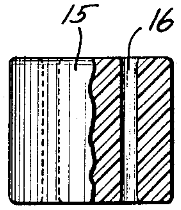
FIGURE 12 is a fragmentary, partially sectional view in side elevation, of the mounting pad or spacer shown in FIGURE 11.
Figure 8:
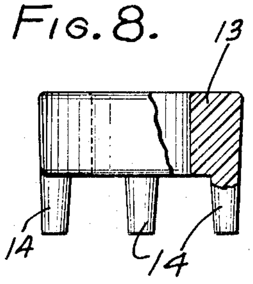
FIGURE 8 is a fragmentary side elevation, partly in section, of the modified form of mounting pad or spacer shown in FIGURE 7.

The form shown in FIGURES 11 and 12 has a thickness equal to the normal thickness of one of the tops such as 5 plus the height of the legs. This forms a type of block designated as 15 and which is provided with transverse bores 16 for the passage of the leads 8 therethrough. The block shown in FIGURES 11 and 12 is circular in outline.

Under certain conditions we have found it expedient to provide tubular legs for the mounting pad or spacer with the bores of said legs communicating with the bores in the top member. This form is used when the transistor casing is quite small in diameter as it allows an equally small top for the mounting pad with the leads from the transistor passed through said bores both in the top and in the legs.

The use of the various forms of mounting pads or spacers of FIGURES 4 to 10 is perhaps understood from the description given for FIGURES 1 to 3 inclusive.

The operation, uses and advantages of the invention described, are as follows.

To assure that the transistor will not be damaged due to heat while soldering, the elevation of the transistor above the circuit board 2 through the use of the mounting pad or spacer, assures heat dissipation away from the transistor. Furthermore, the spacing beneath the pad top and the circuit board allows for air flow and assures against moisture accumulating and being entrapped between the transistor and the circuit board.

We claim:

In combination, a circuit board having circuitry, a transistor having a casing, leads extending from the base of the casing, a spacer having a top member of dielectric thermo-plastic material and conforming to the outline of the base of the transistor casing, said spacer having transverse bores of materially greater diameter than the diameter of the transistor leads, through which bores said leads extend, said spaced having legs in contact with the board to provide an air space between the spacer and the board, said leads being soldered to the circuitry to hold the transistor taut against the board, thus holding the transistor against displacement by vibration or shock.

References Cited in the file of this patent

UNITED STATES PATENTS

| | | |
|---|---|---|
| 1,783,113 | Ogden | Dec. 3, 1929 |
| 2,028,717 | Hayden | Jan. 21, 1936 |
| 2,787,744 | Brock | Apr. 2, 1957 |
| 2,869,104 | Pleak | Jan. 13, 1959 |
| 2,904,772 | Artz | Sept. 15, 1959 |
| 2,916,805 | Plesser | Dec. 15, 1959 |
| 2,960,633 | Hall | Nov. 15, 1960 |
| 2,990,501 | Cornelison et al. | June 27, 1961 |
| 3,002,481 | Hutters | Oct. 3, 1961 |
| 3,031,738 | Paulovitz | May 1, 1962 |
| 3,063,134 | McGraw | Nov. 13, 1962 |

FOREIGN PATENTS

| | | |
|---|---|---|
| 577,265 | Canada | Jan. 12, 1953 |
| 783,923 | Great Britain | Oct. 2, 1957 |
| 1,070,297 | France | Feb. 17, 1954 |

Disclaimer 3,122,679.—*Edward J. Kislan*, Pacoima, *Hubert H. Hoeltje*, Canoga Park, and *Neil O. Regan*, Glendale, Calif. TRANSISTOR MOUNTING PAD. Patent dated Feb. 25, 1964. Disclaimer filed Nov. 2, 1964, by the assignee of 33⅓%, *Collins Radio Company*.

Hereby enters this disclaimer to the sole claim of said patent.

[*Official Gazette February 9, 1965.*]